United States Patent
Wang et al.

(10) Patent No.: US 11,509,320 B2
(45) Date of Patent: *Nov. 22, 2022

(54) SIGNAL CONVERTING APPARATUS AND RELATED METHOD

(71) Applicant: TRON FUTURE TECH INC., Hsinchu (TW)

(72) Inventors: Yu-Jiu Wang, Hsinchu (TW); Chun-Chieh Peng, Hsinchu (TW); Ta-Shun Chu, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/490,542

(22) Filed: Sep. 30, 2021

(65) Prior Publication Data

US 2022/0021396 A1 Jan. 20, 2022

Related U.S. Application Data

(62) Division of application No. 17/064,938, filed on Oct. 7, 2020, now Pat. No. 11,165,435.

(60) Provisional application No. 62/912,113, filed on Oct. 8, 2019.

(51) Int. Cl.
*H03M 1/06* (2006.01)
(52) U.S. Cl.
CPC .................. *H03M 1/0609* (2013.01)
(58) Field of Classification Search
CPC .............................. H03M 1/06; H03M 1/0609
See application file for complete search history.

(56) References Cited

U.S. PATENT DOCUMENTS

| 4,999,624 | A | * | 3/1991 | Pichlik | ................ | H03M 1/0678 |
| | | | | | | 341/118 |
| 5,416,483 | A | | 5/1995 | Matsuya | | |
| 5,579,007 | A | * | 11/1996 | Paul | .................... | H03M 1/0682 |
| | | | | | | 341/172 |
| 5,710,563 | A | * | 1/1998 | Vu | ...................... | H03M 1/0663 |
| | | | | | | 341/161 |

(Continued)

OTHER PUBLICATIONS

Taiwanese Notice of Allowance and Search Report, dated Mar. 8, 2021, for Taiwanese Application No. 103134763, with an English translation of the Taiwanese Notice of Allowance.

*Primary Examiner* — Lam T Mai
(74) *Attorney, Agent, or Firm* — Birch, Stewart, Kolasch & Birch, LLP

(57) ABSTRACT

A signal converting apparatus includes a comparing device, a first digital-slope quantizer, and a second digital-slope quantizer. The comparing device having a first input terminal and a second input terminal for receiving a first received signal and a second received signal, and for generating an output signal at an output port. The first digital-slope quantizer generates a first set of digital signals to monotonically adjust the first received signal and the second received signal at the first input terminal and the second input terminal during a first phase according to a first quantization unit. The second digital-slope quantizer generates a second set of digital signals to monotonically adjust the first received signal and the second received signal at the first input terminal and the second input terminal during a second phase after the first phase according to a second quantization unit.

20 Claims, 8 Drawing Sheets

(56) References Cited

U.S. PATENT DOCUMENTS

| | | |
|---|---|---|
| 5,757,306 A | 5/1998 | Nomura |
| 5,942,997 A * | 8/1999 | Silver .................. H03M 1/121 |
| | | 341/171 |
| 5,953,460 A | 9/1999 | Wu |
| 6,404,364 B1 * | 6/2002 | Fetterman ........... H03M 1/0641 |
| | | 341/161 |
| 6,556,625 B2 | 4/2003 | Haskell et al. |
| 6,784,824 B1 * | 8/2004 | Quinn ...................... G06G 7/14 |
| | | 341/172 |
| 7,099,823 B2 | 8/2006 | Takamizawa |
| 7,680,670 B2 | 3/2010 | Lamblin et al. |
| 8,698,660 B2 | 4/2014 | Mallinson et al. |
| 8,756,056 B2 | 6/2014 | Grill et al. |
| 9,503,120 B1 | 11/2016 | Tan et al. |
| 10,862,464 B1 * | 12/2020 | Chuang .................. H03K 5/249 |
| 2002/0167437 A1 * | 11/2002 | Tanabe ................... H03M 1/44 |
| | | 341/161 |
| 2007/0194971 A1 | 8/2007 | Yamaji et al. |
| 2009/0121912 A1 * | 5/2009 | Zanchi ............. H03K 19/00384 |
| | | 341/172 |
| 2009/0295615 A1 | 12/2009 | Steiner |
| 2011/0309958 A1 | 12/2011 | Yoo et al. |
| 2013/0132100 A1 | 5/2013 | Sung et al. |
| 2015/0358029 A1 | 12/2015 | Wang |
| 2016/0134300 A1 * | 5/2016 | Wang ...................... H03M 3/37 |
| | | 341/172 |
| 2019/0285468 A1 | 9/2019 | Berkovich et al. |
| 2019/0379388 A1 * | 12/2019 | Gao ........................ H03M 1/58 |

* cited by examiner

SIGNAL CONVERTING APPARATUS AND RELATED METHOD

CROSS-REFERENCE TO RELATED APPLICATIONS

This application is a Divisional of co-pending U.S. patent application Ser. No. 17/064,938, filed Oct. 7, 2020, which claims priority under 35 U.S.C. 119(e) to U.S. Provisional Application No. 62/912,113 filed on Oct. 8, 2019. The entire contents of which are hereby incorporated by reference for all purposes.

BACKGROUND

The disclosure generally relates to a signal converting apparatus and, more particularly, to a high resolution and high speed analog-to-digital converter (ADC).

With the growth of telecommunications applications, the demand for high-speed and low-power ADC with high resolutions has increased dramatically. Conventionally, the Flash-assisted successive approximation ADC (SAR-ADC) is a typical high-speed multi-bit/cycle ADCs comprising the flash architecture as the multi-bit quantizers and operating with the asynchronous SAR algorithm. However, the comparator offsets and the inaccurate reference voltages of SAR-ADC may degrade the comparison performance. SAR-assisted pipeline ADC is another conventional ADC. The SAR-assisted pipeline ADC is implemented by the pipeline ADCs with the SAR architecture as the quantizer. However, the complicated foreground and background calibrations are required for the process, voltage, and temperature (PVT) variations. Therefore, how to provide a high-speed and low-power ADC with high resolutions is highly desirable in this field.

SUMMARY

An example embodiment of a signal converting apparatus is disclosed. The signal converting apparatus comprises: a comparing device, a first digital-slope quantizer, and a second digital-slope quantizer. The comparing device has a first input terminal and a second input terminal for receiving a first received signal and a second received signal respectively, and for generating an output signal at an output port, wherein the first received signal and the second received signal are arranged to be a differential received signal. The first digital-slope quantizer is coupled to the output port, the first input terminal, and the second input terminal, for generating a first set of digital signals to monotonically adjust the first received signal and the second received signal at the first input terminal and the second input terminal, respectively, during a first phase according to a first quantization unit. The second digital-slope quantizer is coupled to the output port, the first input terminal, and the second input terminal, for generating a second set of digital signals to monotonically adjust the first received signal and the second received signal at the first input terminal and the second input terminal, respectively, during a second phase after the first phase according to a second quantization unit. The second quantization unit is different from the first quantization unit.

Another example embodiment of a signal converting method is disclosed. The signal converting method comprises the steps of: arranging an input port of a comparing device to receive a received signal and to generate an output signal at an output port of the comparing device; generating a first set of digital signals to monotonically adjust the received signal at the input port during a first phase according to a first quantization unit; and generating a second set of digital signals to monotonically adjust the received signal at the input port during a second phase after the first phase according to a second quantization unit; wherein the second quantization unit is different from the first quantization unit.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
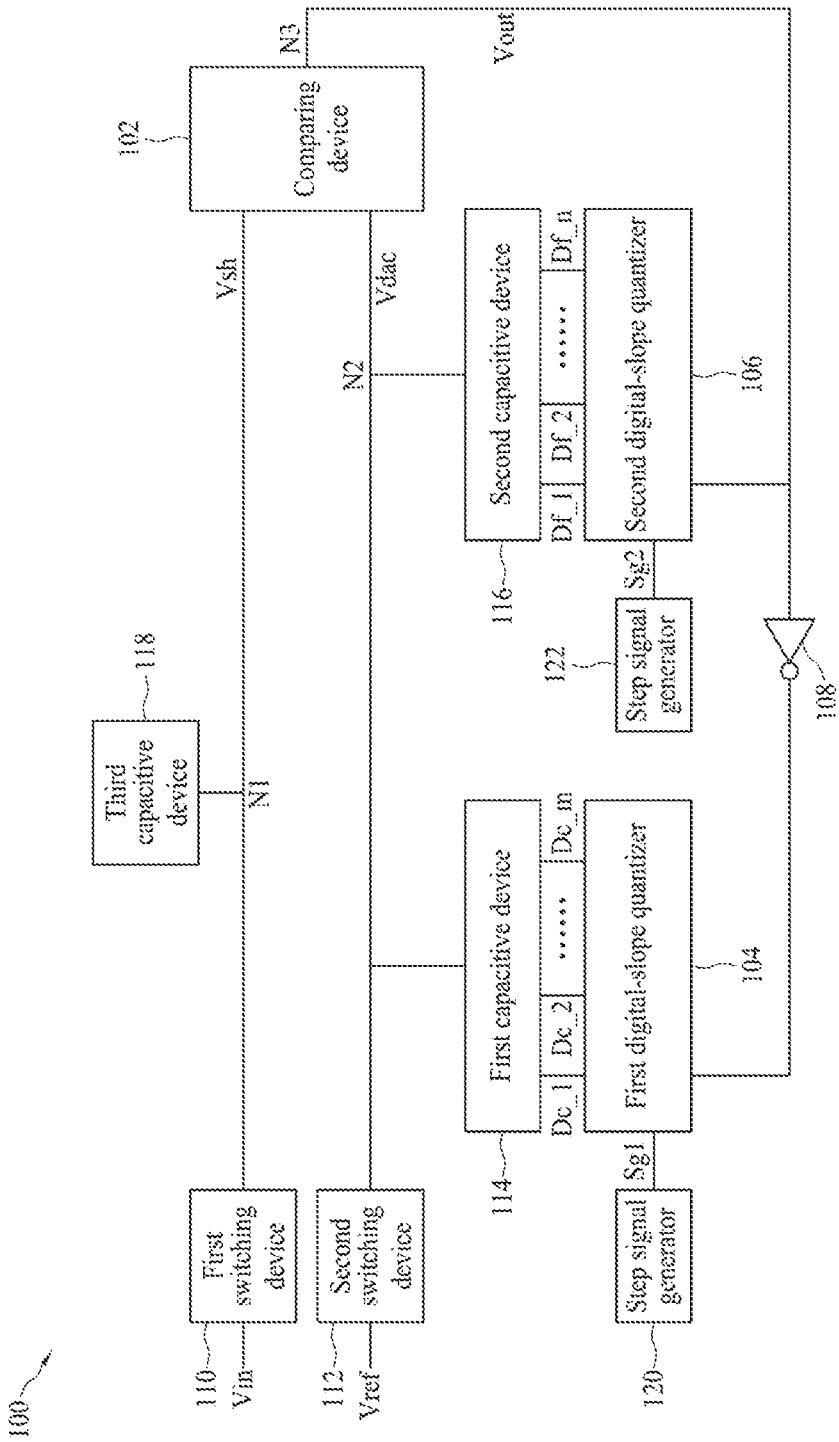
FIG. 1 is a block diagram illustrating a signal converting apparatus according to an embodiment of the present disclosure.

FIG. 1 is a block diagram illustrating a signal converting apparatus 100 according to an embodiment of the present disclosure. The signal converting apparatus 100 is an analog-to-digital converter (ADC). More specifically, the signal converting apparatus 100 is a single-end successive approximation ADC (SAR-ADC). However, this is not a limitation of the present invention. In the later paragraphs, a differential SAR-ADC is also presented. In the embodiment as shown in FIG. 1, the signal converting apparatus 100 comprises, but not limits to, a comparing device 102, a first digital-slope quantizer 104, a second digital-slope quantizer 106, an inverting device 108, a first switching device 110, a second switching device 112, a first capacitive device 114, a second capacitive device 116, and a third capacitive device 118. The capacitance of the first capacitive device 114 is different from (e.g. is greater than) the capacitance of the second capacitive device 116.

The comparing device 102 has a first input terminal N1 and a second input terminal N2 for receiving a received signal Vsh and an adjustable reference voltage Vdac respectively, and for generating an output signal Vout at an output port N3 according to the received signal Vsh and the adjustable reference voltage Vdac. The first digital-slope quantizer 112 is coupled to the output port N3 and the input terminal N2 for generating a first set of digital signals Dc_1~Dc_m to monotonically adjust the adjustable reference voltage Vdac at the input terminal N2 during a first phase according to a first quantization unit Q1. The second digital-slope quantizer 114 is coupled to the output port N3 and the input terminal N2 for generating a second set of digital signals Df_1~Df_n to monotonically adjust the adjustable reference voltage Vdac at the input terminal N2 during a second phase after the first phase according to a second quantization unit Q2, wherein the second quantization unit Q2 is different from the first quantization unit Q1. The switching device 110 is coupled to the input terminal N1 for selectively conducting the analog input signal Vin to the input terminal N1. The switching device 112 is coupled to the input terminal N2 for selectively conducting the reference voltage Vref to the input terminal N2. The capacitive device 118 is coupled to the switching device 110 and the input terminal N1. The capacitive device 114 is coupled to the switching device 112 and the input terminal N2. The capacitive device 116 is coupled to the switching device 112 and the input terminal N2. The connectivity among the comparing device 102, the first digital-slope quantizer 104, the second digital-slope quantizer 106, the inverting device 108, the first switching device 110, the second switching device 112, the first capacitive device 114, the second capacitive device 116, and the third capacitive device 118 are shown in FIG. 1, and the detailed description is omitted here for brevity.

Figure 2:
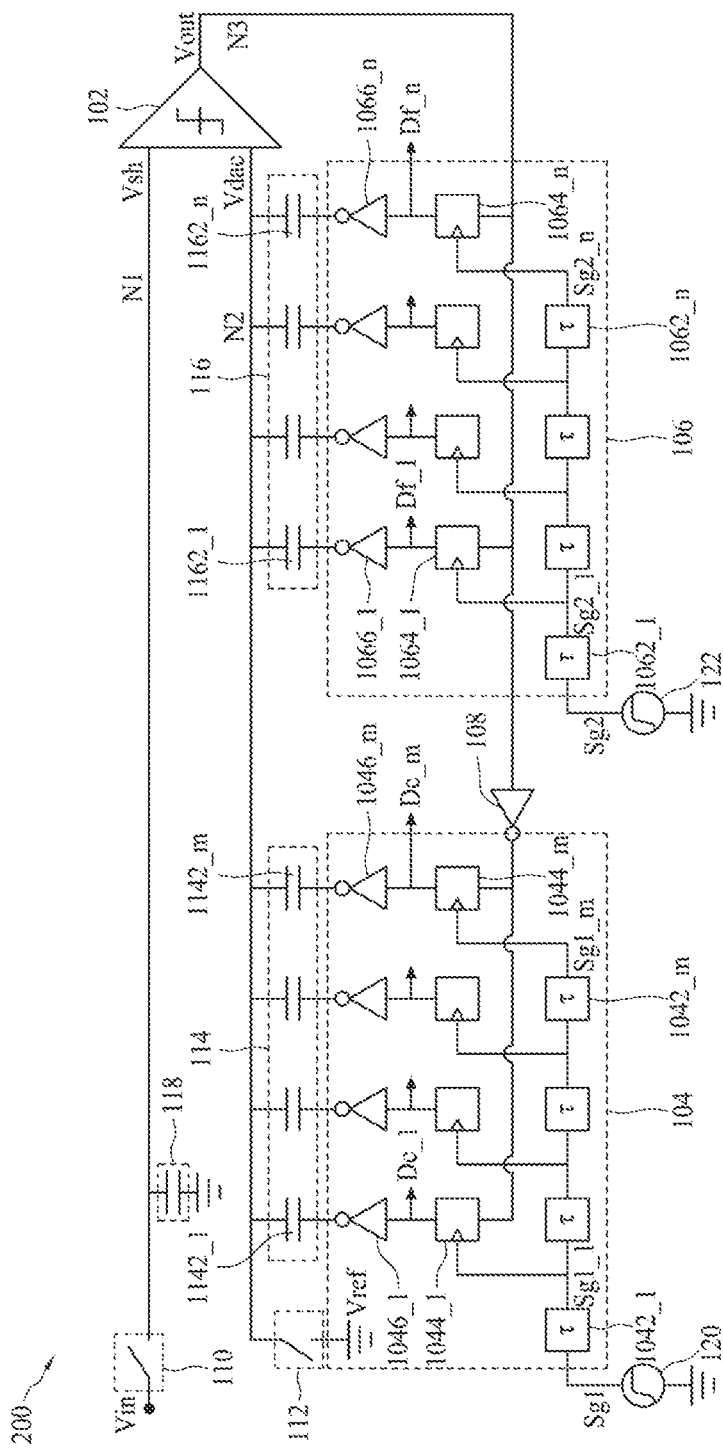
FIG. 2 is a diagram illustrating a signal converting apparatus according to an embodiment of the present disclosure.

FIG. 2 is a diagram illustrating a signal converting apparatus 200 according to an embodiment of the present disclosure. The signal converting apparatus 200 may be an implementation of the signal converting apparatus 100. For brevity, the device numerals and signal names in the signal converting apparatus 200 are similar to those in the signal converting apparatus 100. In the embodiment as shown in FIG. 2, the first digital-slope quantizer 104 comprises a plurality of delay circuits 1042_1~1042_m, a plurality of latching circuits 1044_1~1044_m, and a plurality of inverting circuits 1046_1~1046_m. The plurality of delay circuits 1042_1~1042_m is arranged to generate a plurality of first delayed control signals Sg1_1-Sg1_m according to a first control signal Sg1. The plurality of delay circuits 1042_1~1042_m is coupled to a step signal generator 120 for receiving the first control signal Sg1, and each output terminal of the delay circuits 1042_1~1042_m is coupled to each input terminal of the latching circuits 1044_1~1044_m. The plurality of latching circuits 1044_1~1044_m is coupled to the output port N3 and the capacitive device 114 for generating the first set of digital signals Dc_1~Dc_m according to the plurality of first delayed control signals Sg1_1-Sg1_m and the output signal Vout during the first phase. The inverting circuit 108 has an input terminal coupled to the output port N3 and an output terminal coupled to the plurality of first latching circuits 1044_1~1044_m for generating an inverted output signal at the output terminal. The inverting device 108 is arranged to invert the output signal Vout, and the inverted output signal is transmitted to each control terminal of the latching circuits 1044_1~1044_m. The first set of digital signals Dc_1~Dc_m are generated from the output terminals of the latching circuits 1044_1~1044_m respectively. The capacitive device 114 comprises a plurality capacitors 1142_1~1142_m. The latching circuits 1044_1~1044_m (or the first set of digital signals Dc_1~Dc_m) are coupled to the first electrodes (e.g. the bottom plates) of the capacitors 1142_1~1142_m respectively. The second electrodes (e.g. the top plates) of the capacitors 1142_1~1142_m are electrically connected to the second input terminal N2 of the comparing device 102.

In addition, the second digital-slope quantizer 106 comprises a plurality of delay circuits 1062_1~1062n, a plurality of latching circuits 1064_1~1064_n, and a plurality of inverting circuits 1066_1~1066_n. The plurality of second delay circuits 1062_1~1062_n is arranged to generate a plurality of second delayed control signals Sg2_1-Sg2_n according to a second control signal Sg2. The plurality of delay circuits 1062_1~1062_n is coupled to a step signal generator 122 for receiving the second control signal Sg2, and each output terminal of the delay circuits 1062_1~1062_n is coupled to each input terminal of the latching circuits 1064_1~1064_n. The plurality of second latching circuits 1064_1~1064_n is coupled to the output port N3 and the capacitive device 116 for generating the second set of digital signals Df_1~Df_n according to the plurality of second delayed control signals Sg2_1-Sg2_n and the output signal Vout during the second phase. The output signal Vout is transmitted to each control terminal of the latching circuits 1064_1~1064_n. The second set of digital signals Df_1~Df_n are generated from the output terminals of the latching circuits 1064_1~1064_n respectively. The capacitive device 116 comprises a plurality of capacitors 1162_1~1162_n. The latching circuits 1064_1~1064_n (or the second set of digital signals Df_1~Df_n) are coupled to the first electrodes (e.g. the bottom plates) of the capacitors 1162_1~1162_n respectively. The second electrodes (e.g. the top plates) of the capacitors 1162_1~1162_n are electrically connected to the second input terminal N2 of the comparing device 102.

According to the embodiment, the capacitances of the capacitors 1142_1~1142_m are the same with each other, the capacitances of the capacitors 1162_1~1162_n are the same with each other. However, the capacitance (e.g. 4C) of a single capacitor in the capacitors 1142_1~1142_m is greater than the capacitance (e.g. C) of a single capacitor in the capacitors 1162_1~1162_n. Therefore, the quantization unit Q1 imposed upon the of the adjustable reference voltage Vdac by the capacitive device 114 is greater than the quantization unit Q2 imposed upon the of the adjustable reference voltage Vdac by the capacitive device 116, and the detailed operation will be described in later paragraphs.

Figure 3:
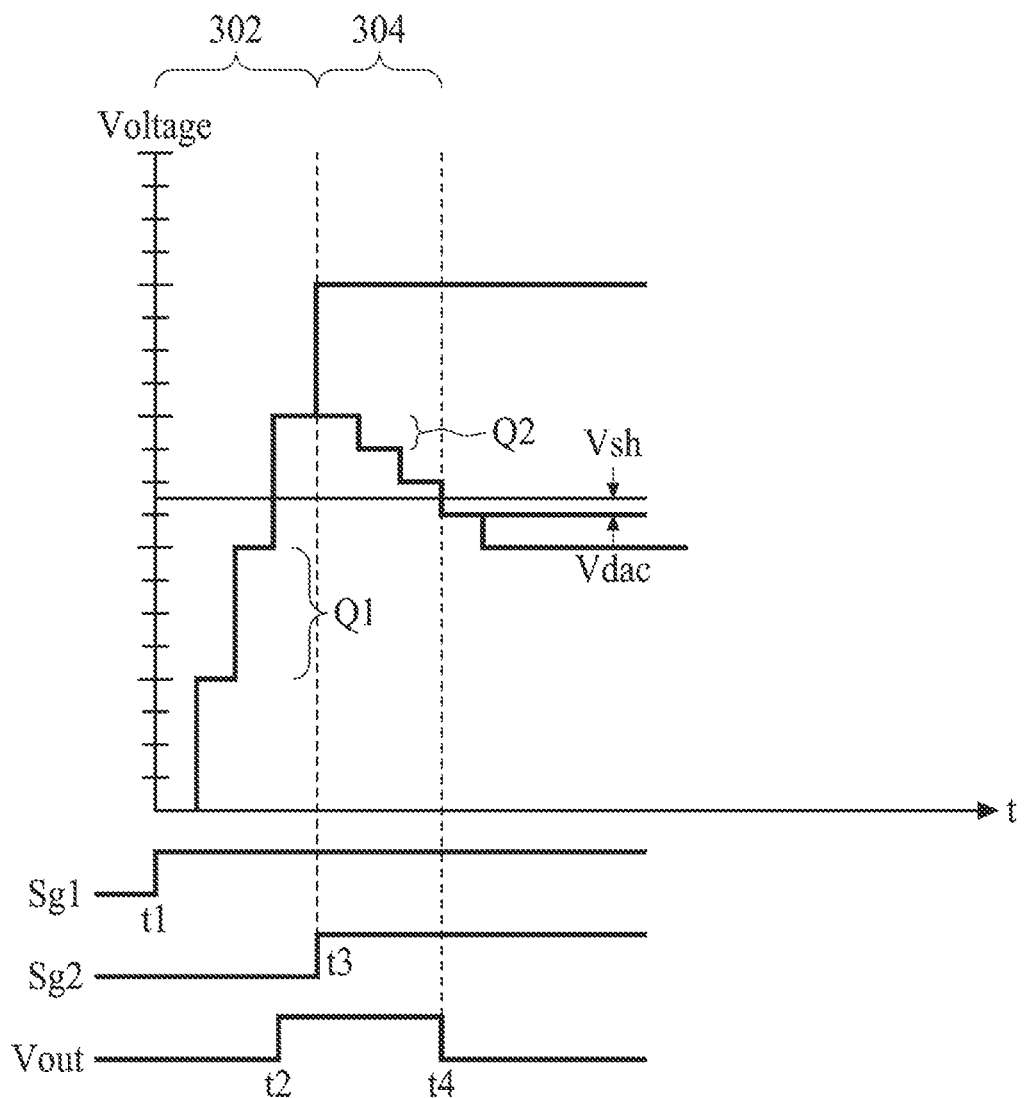
FIG. 3 is a timing diagram illustrating an example of the operation of a signal converting apparatus according to an embodiment of the present invention.

The operation of the signal converting apparatus 200 or 100 may be simplified in FIG. 3, which is a timing diagram illustrating an example of the operation of the signal converting apparatus 200 or 100 according to an embodiment of the present invention. For illustration purposes, the operation of the signal converting apparatus 200 may be simplified into two phases. The first phase is the first cycle conversion phase 302 and the second phase is the second cycle conversion phase 304. According to the embodiment, the first cycle conversion phase 302 is the coarse digital-slope conversion, and the second cycle conversion phase 304 is the fine digital-slope conversion. During the first cycle conversion phase 302, when the voltage level of the received signal Vsh is greater than the adjustable reference voltage Vdac, the first digital-slope quantizer 104 is arranged to monotonically increase the adjustable reference voltage Vdac at the second input terminal N2 until the adjustable reference voltage Vdac is greater than the voltage level of the received signal Vsh according to the first quantization unit Q1. When the voltage level of the received signal Vsh is lower than the adjustable reference voltage Vdac, the first digital-slope quantizer 104 is arranged to monotonically decrease the adjustable reference voltage Vdac at the second input terminal N2 until the adjustable reference voltage Vdac is lower than the voltage level of the received signal Vsh according to the first quantization unit Q1. More specifically, during the first cycle conversion phase 302, the first digital-slope quantizer 104 is arranged to control the adjustable reference voltage Vdac to monotonically approach to the received signal Vsh by the quantization unit Q1. The voltage approximation continues until the zero-crossing happened, which changes the polarity of the output of the inverting device 108, and consequently stops the operation of the first digital-slope quantizer 104.

Then, during the second cycle conversion phase 304, when the voltage level of the received signal Vsh is greater than the adjustable reference voltage Vdac, the second digital-slope quantizer 106 is arranged to monotonically increase the adjustable reference voltage Vdac at the second input terminal N2 until the adjustable reference voltage Vdac is greater than the voltage level of the received signal Vsh according to the second quantization unit Q2. When the voltage level of the received signal Vsh is lower than the adjustable reference voltage Vdac, the second digital-slope quantizer 106 is arranged to monotonically decrease the adjustable reference voltage Vdac at the second input terminal N2 until the adjustable reference voltage Vdac is lower than the voltage level of the received signal Vsh according to the second quantization unit Q2. More specifically, the second digital-slope quantizer 106 is arranged to control the adjustable reference voltage Vdac to monotonically approach to the received signal Vsh by the quantization unit Q2. The voltage approximation continues until the zero-crossing happened, which changes the polarity of the output signal Vout, and consequently stops the operation of the second digital-slope quantizer 106.

Please refer to FIG. 3 again. At time t1, the first cycle conversion phase 302 starts, and the voltage level of the step signal Sg1 is changed to the high voltage level (for example) to sequentially trigger the latching circuits 1044_1~1044_m in the first digital-slope quantizer 104 through the delay circuits 1042_1~1042_m. Each of the delay circuits 1042_1~1042_m has a delay time tu, and the operating frequency of the signal converting apparatus 200 is proportional to the inverse of the delay time tu. The delay time tu is greater than the time constant on the second input terminal N2. For each comparison of the comparing device 102, the corresponding latching circuit may output a digital signal corresponding to the output signal Vout. The digital signal is arranged to charge (for example) a corresponding capacitor in the capacitors 1142_1~1142_m such that the adjustable reference voltage Vdac may be changed by the quantization unit Q1 for each comparison. Therefore, the latching circuits 1044_1~1044_m may sequentially generate the first set of digital signals Dc_1~Dc_m.

At time t2, the adjustable reference voltage Vdac crosses the received signal Vsh, and the voltage level of the output signal Vout changes. The output signal Vout may deactivate the first digital-slope quantizer 104 and the voltage level of the step signal Sg1 is kept on the high voltage level after time t2. Then, the second cycle conversion phase 304 starts at time t3, the voltage level of the step signal Sg2 is changed to the high voltage level (for example) to sequentially trigger the latching circuits 1064_1~1064_n in the second digital-slope quantizer 106 through the delay circuits 1062_1~1062_n. Each of the delay circuits 1062_1~1062_n has a delay time tu. For each comparison of the comparing device 102, the corresponding latching circuit may output a digital signal corresponding to the output signal Vout. The digital signal is arranged to charge (for example) a corresponding capacitor in the capacitors 1162_1~1162_n such that the adjustable reference voltage Vdac may be changed by the quantization unit Q2 for each comparison. Therefore, the latching circuits 1064_1~1064_n may sequentially generate the second set of digital signals Df_1~Df_n during the second cycle conversion phase 304. At time t4, the adjustable reference voltage Vdac crosses the received signal Vsh, and the voltage level of the output signal Vout changes again. Then, the first cycle conversion phase 302 and the second cycle conversion phase 304 completes, and the digital signals Dc_1~Dc_m and Df_1~Df_n corresponding to the input signal Vin may be obtained.

As the capacitance of each of the capacitors 1142_1~1142_m is greater than the capacitance of each of the capacitors 1162_1~1162_n, the quantization unit Q1 is greater than the quantization unit Q2. In other words, the first digital-slope quantizer 104 is arranged to perform the coarse-bit digital-slope comparison to generate the higher significant bits (i.e. Dc_1~Dc_m) corresponding to the input signal Vin, and the second digital-slope quantizer 106 is arranged to perform the fine-bit digital-slope comparison to generate the lower significant bits (i.e. Df_1~Df_n) corresponding to the input signal Vin.

Figure 4:
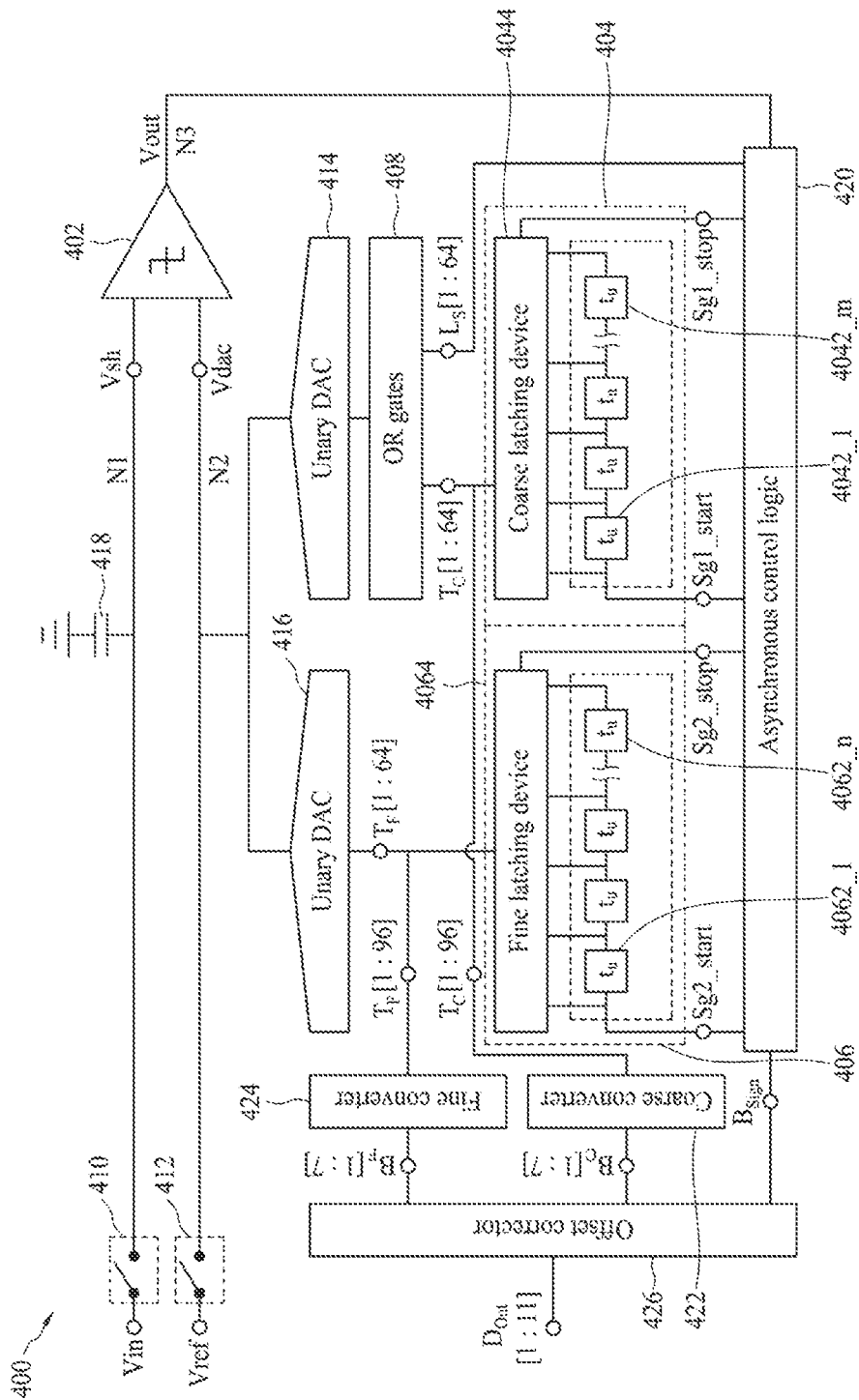
FIG. 4 is a block diagram illustrating a signal converting apparatus according to an embodiment of the present disclosure.

FIG. 4 is a block diagram illustrating a signal converting apparatus 400 according to an embodiment of the present disclosure. The signal converting apparatus 400 is a single-end SAR-ADC. However, this is not a limitation of the present invention. In the later paragraphs, a differential SAR-ADC is also presented. The signal converting apparatus 400 may be another embodiment of the signal converting apparatus 100. In the embodiment as shown in FIG. 4, the signal converting apparatus 400 comprises a comparing device 402, a first digital-slope quantizer 404, a second digital-slope quantizer 406, an OR gates 408, a first switching device 410, a second switching device 412, a first unary DAC 414, a second unary DAC 416, a third capacitive device 418, an asynchronous control logic 420, a coarse converter 422, a fine converter 424, and a offset corrector 426. The asynchronous control logic 420 is coupled to the output port N3, and one of the functions of the asynchronous control logic 420 is to generate a specific digital signal $L_S[1:64]$ according to the output signal Vout during the second cycle conversion phase 506 and the third cycle conversion phase 508 (see FIG. 5 later). The asynchronous control logic 420 is arranged to shift the adjustable reference voltage Vdac to generate a first shifted reference voltage at the second input terminal N2 according to the specific digital signal $L_S[1:64]$. The connectivity among the comparing device 402, the first digital-slope quantizer 404, the second digital-slope quantizer 406, the OR gates 408, the first switching device 410, the second switching device 412, the first unary DAC 414, the second unary DAC 416, the third capacitive device 418, the asynchronous control logic 420, the coarse converter 422, the fine converter 424, and the offset corrector 426 are shown in FIG. 4, and the detailed description is omitted here for brevity.

For brevity, the device numerals and signal names in the signal converting apparatus 400 are similar to those in the signal converting apparatus 200. In the embodiment as shown in FIG. 4, the first digital-slope quantizer 404 comprises a plurality of delay circuits 4042_1~4042_m and a coarse latching device 4044. The second digital-slope quantizer 406 comprises a plurality of delay circuits 4062_1~4062_n and a fine latching device 4064.

According to the embodiment, the coarse latching device 4044 is similar to the above mentioned latching circuits 1044_1~1044_m, and the fine latching device 4064 is similar to the above mentioned latching circuits 1064_1~1064_n. The first unary DAC 414 is similar to the above mentioned first capacitive device 114, and the second unary DAC 416 is similar to the above mentioned second capacitive device 116.

Figure 5:
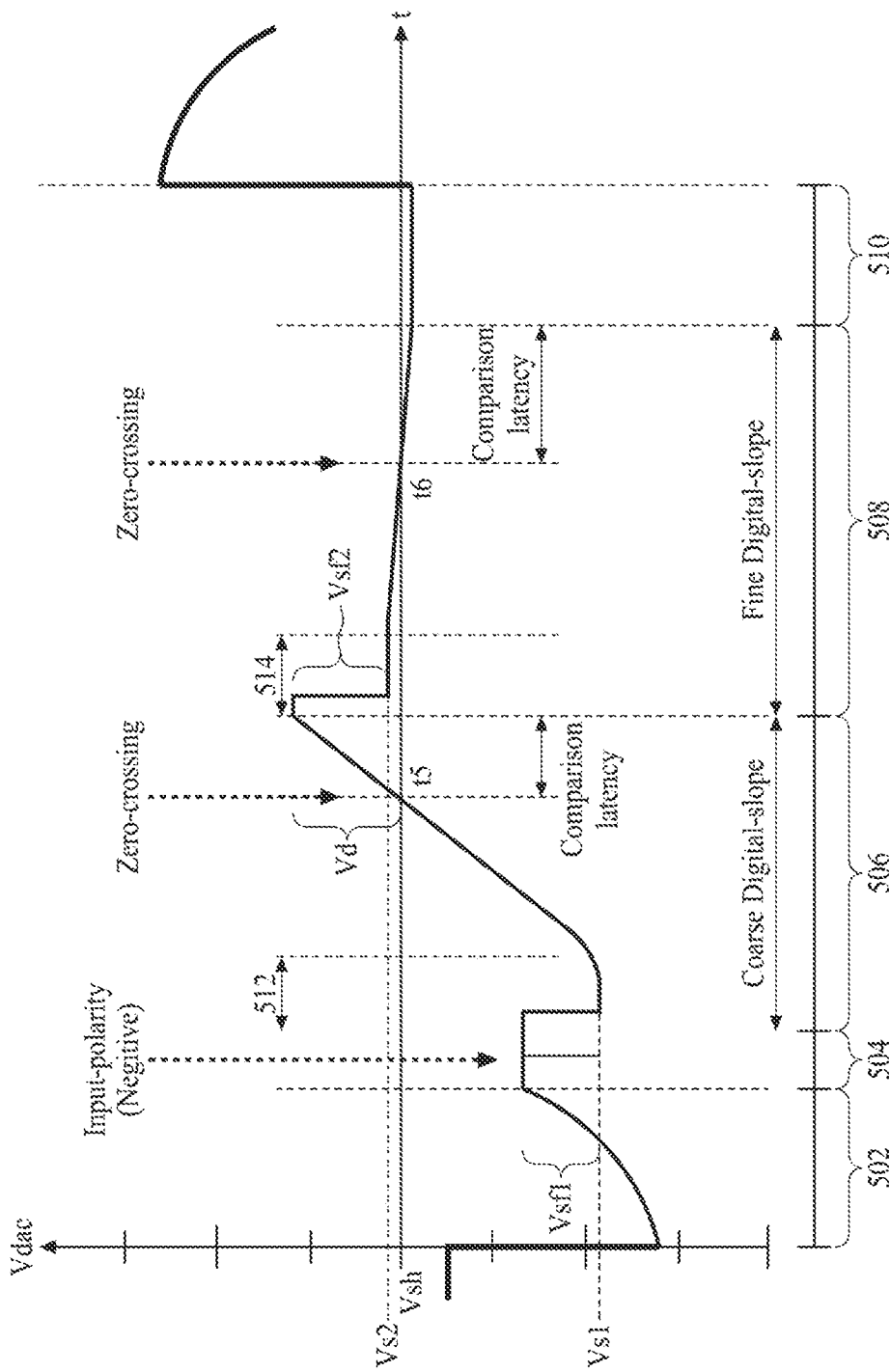
FIG. 5 is a timing diagram illustrating an example of the operation of a signal converting apparatus according to an embodiment of the present invention.

Similar to the signal converting apparatus 200, the signal converting apparatus 400 is a hybrid ADC or a two-step digital slope ADC. According to the embodiment, the operation of the signal converting apparatus 400 may be divided into, but not limited to, five phases as shown in FIG. 5, which is a timing diagram illustrating an example of the operation of the signal converting apparatus 400 according to an embodiment of the present invention. The first phase is the track and hold phase 502, the second phase is the first cycle conversion phase 504, the third phase is the second cycle conversion phase 506, the fourth phase is the third cycle conversion phase 508, and the fifth phase is the idle phase 510. The order of the five phases is the track and hold phase 502, followed by the first cycle conversion phase 504, followed by the second cycle conversion phase 506, followed by the third cycle conversion phase 508, followed by the idle phase 510. The input signal polarity is provided by the first cycle conversion phase 504. The second cycle conversion phase 506 and the third cycle conversion phase 508 take the digital-slope operation for multibit quantization. The level-shifting process is included before each digital-slope conversion. According to an example of the embodiment, the first cycle conversion phase 504, the second cycle conversion phase 506, and the third cycle conversion phase 508 provide the signal converting apparatus 400 with 1-bit, 5.7-bit, and 4-bit resolution, respectively.

During the track and hold phase 502, the first switching device 410 is arranged to conduct an analog input signal Vin to the first input terminal N1 of the comparing device 402, and the capacitive device 418 is arranged to track and hold the analog input signal Vin to generate the received signal Vsh. The second switching device 412 is arranged to conduct the reference voltage Vref to the second input terminal N2 of the comparing device 402 to be the adjustable reference voltage Vdac.

During the first conversion phase 504, the comparing device 502 is arranged to generate an output signal Vout at an output port N3 according to the received signal Vsh and the adjustable reference voltage Vdac. The comparing device 502 may compare the voltage level of the received signal Vsh and the adjustable reference voltage Vdac to generate a compared output, i.e. the output signal Vout. The input polarity of the analog input signal Vin may be obtained according to the output signal Vout during the first conversion phase 504.

More specifically, during the track and hold phase 502 and the first conversion phase 504, the analog input signal Vin is sampled through the top-plate sampling. Since the digital-slope quantizer is a unipolar architecture, the output latch of the comparing device 402 defines the polarity of the analog input signal Vin (e.g. negative) as the input-polarity to determine the operation of the following two-stage digital-slope conversion, i.e. the second cycle conversion phase 506 and the third cycle conversion phase 508.

Next, since the non-ideal effects of input polarity and non-linear digital slope, which may degrade the performance of quantizers, a coarse level-shifting process 512 is performed at the beginning of the second cycle conversion phase 506 based on the polarity obtained in the first conversion phase 504. After a zero crossing happened during the second cycle conversion phase 506 at time t5, the output polarity of the comparing device 402 is changed and stops the coarse latching device 4044 from being triggered by the delay circuits 4042_1~4042_m.

During the second conversion phase 506, the first digital-slope quantizer 504 is arranged to generate the first set of digital signals $T_C[1:64]$ (for example) to the first unary DAC 414 to monotonically adjust the adjustable reference voltage Vdac at the second input terminal N2 according to the first quantization unit Q1. In this embodiment, when the voltage level of the received signal Vsh is greater than the reference voltage Vref, the first digital-slope quantizer 404 is arranged to monotonically increase the adjustable reference voltage Vdac by the first quantization unit Q1 until the adjustable reference voltage Vdac is greater than the voltage level of the received signal Vsh. When the voltage level of the received signal Vsh is smaller than the reference voltage Vref, the first digital-slope quantizer 404 is arranged to monotonically decrease the adjustable reference voltage Vdac by the first quantization unit Q1 until the voltage level of the received signal Vsh is greater than the adjustable reference voltage Vdac (e.g. at time t6). During the process of monotonically adjusting the adjustable reference voltage Vdac, the first set of digital signals $T_C[1:64]$ may be obtained.

Then, during the third conversion phase 508, the second digital-slope quantizer 506 is arranged to generate the second set of digital signals $T_F[1:64]$ (for example) to the second unary DAC 416 to monotonically adjust the adjustable reference voltage Vdac at the second input terminal N2 according to the second quantization unit Q2, wherein the second quantization unit Q2 is smaller than the first quantization unit Q1. In this embodiment, when the voltage level of the received signal Vsh is greater than the adjustable reference voltage Vdac, the second digital-slope quantizer 506 is arranged to monotonically increase the adjustable reference voltage Vdac by the second quantization unit Q2 until the adjustable reference voltage Vdac is greater than the voltage level of the received signal Vsh. When the voltage level of the received signal Vsh is smaller than the reference voltage Vref, the second digital-slope quantizer 506 is arranged to monotonically decrease the adjustable reference voltage Vdac by the second quantization unit Q2 until the voltage level of the received signal Vsh is greater than the adjustable reference voltage Vdac. During the process of monotonically adjusting the adjustable reference voltage Vdac, the second set of digital signals $T_F[1:64]$ may be obtained.

However, due to the parasitic delay of the comparing device 402 and the first digital-slope quantizer 404 as well as the second digital-slope quantizer 406, the adjustable reference voltage Vdac cannot be stopped immediately after zero-crossing, causing a voltage difference Vd between the received signal Vsh and the adjustable reference voltage Vdac. The voltage difference Vd, which is related to the digital-offset of the first digital-slope quantizer 404, pushes the residual voltage out of the input-range of the fine digital-slope conversion. A 2-bit (for example) redundancy with the fine level-shifting process 514 can convert the input-level to the specified operating range properly. The second digital-slope quantizer 406 together with the second unary DAC 416 and the comparing device 402 may perform the fine digital-slope conversion after the fine level-shifting process 514, and the polarity of the comparing device 402 changes again with the fine digital-slope conversion. According to the embodiment, the quantized-results (i.e. $T_C[1:64]$ and $T_F[1:64]$) and control signals are being registered and reset, respectively, before the next sampling phase to ensure that the conversions do not interfere with each other. The output encoding performed by the coarse converter 422 and the fine converter 424 and offset correction performed by the offset corrector 426 are processed in parallel with the next comparison cycle to reduce the transistor size and power consumption of the coarse converter 422, the fine converter 424, and the offset corrector 426.

Please refer to FIG. 4 again. The first switching device 410 together with the third capacitive device 418 may be a bootstrapped switch, which achieves both smaller on-resistance and minimal signal-dependent sampling distortion. Both the coarse and fine digital-slope quantizers (i.e. 404 and 406 respectively) consist of DS Logic with 96 sets of the dynamic latch (i.e. 4044 and 4064 respectively) with sufficient delay cells (i.e. 4042_1~4042_m and 4062_1~4062_n respectively). For the example of the coarse digital-slope quantizer (i.e. 404), the first 64 dynamic latches in the coarse latching device 4044, each of which is connected to the bottom plate of the capacitor (i.e. the first unary DAC 414 or the first capacitive device 114 in FIG. 2), are used for the typical digital-slope conversion, and the remaining 32 dynamic latches in the coarse latching device 4044 are used for compensating the feedback process latency caused by the coarse latching device 4044, the first unary DAC 414, and the comparing device 402, i.e. the comparison latency compensation (CLC). Since the two-stage operation includes a 2-bit redundancy (for example), the fine digital-slope quantizer (i.e. 406) only provides a 4-bit resolution (for example). The two capacitors (i.e. the first unary DAC 414 and the second unary DAC 416) with different operating polarities represent a single weighting to maintain a constant common-mode voltage in the system, and the slope of the coarse digital-slope quantizer (i.e. 404) is 16 times (for example) larger than the fine digital-slope quantizer (i.e. 406) due to the weighting difference between two quantizers. The additional gain-error calibrations are avoided due to the shared DAC, and the coarse and fine quantizer also share the continuous-time comparator (i.e. the comparing device 402), thus reducing the power consumption of the signal converting apparatus 400.

In addition, the digital-slope conversion of the coarse digital-slope quantizer (i.e. 404) mainly has two digital control signals, i.e. Sg1_start and Sg1_stop. The digital-slope conversion of the fine digital-slope quantizer (i.e. 406) mainly has two digital control signals, i.e. Sg2_start and Sg2_stop. The digital control signals Sg1_start and Sg2_start trigger the delay lines (i.e. 4042_1~4042_m and 4062_1~4062_n respectively) to start the quantization of the asynchronous digital-slope quantizers respectively. The digital control signals Sg1_stop and Sg2_stop the coarse and fine digital-slope quantizers (i.e. 404 and 406) respectively. Besides, the level-shifting controlled by $L_S[1:64]$ shares the same unary DAC (i.e. 414) with the coarse DS Logic (4044) without using additional capacitors, and two control signals $T_C[1:64]$ and $L_S[1:64]$ are combined with the OR gates 408 to operate both functions with different capacitor polarities. The asynchronous control logic 420 performs a finite-state machine for the signal converting apparatus 400, which operates sequentially with 1-bit input-polarity definition $B_{Sign}$ followed by the coarse and fine digital-slope conversion. The T2B encoders (i.e. 422 and 424) convert the counting results of the two quantizers $T_C[1:96]$ and $T_F[1:96]$ into a 7-bit binary output $B_C[1:7]$ and $B_F[1:7]$, respectively. The three sets of signals, including the 1-bit $B_{Sign}$, are encoded, and the digital-offset is subtracted through the offset corrector 426 to obtain the digital output $D_{Out}$ [1:11].

Figure 6:
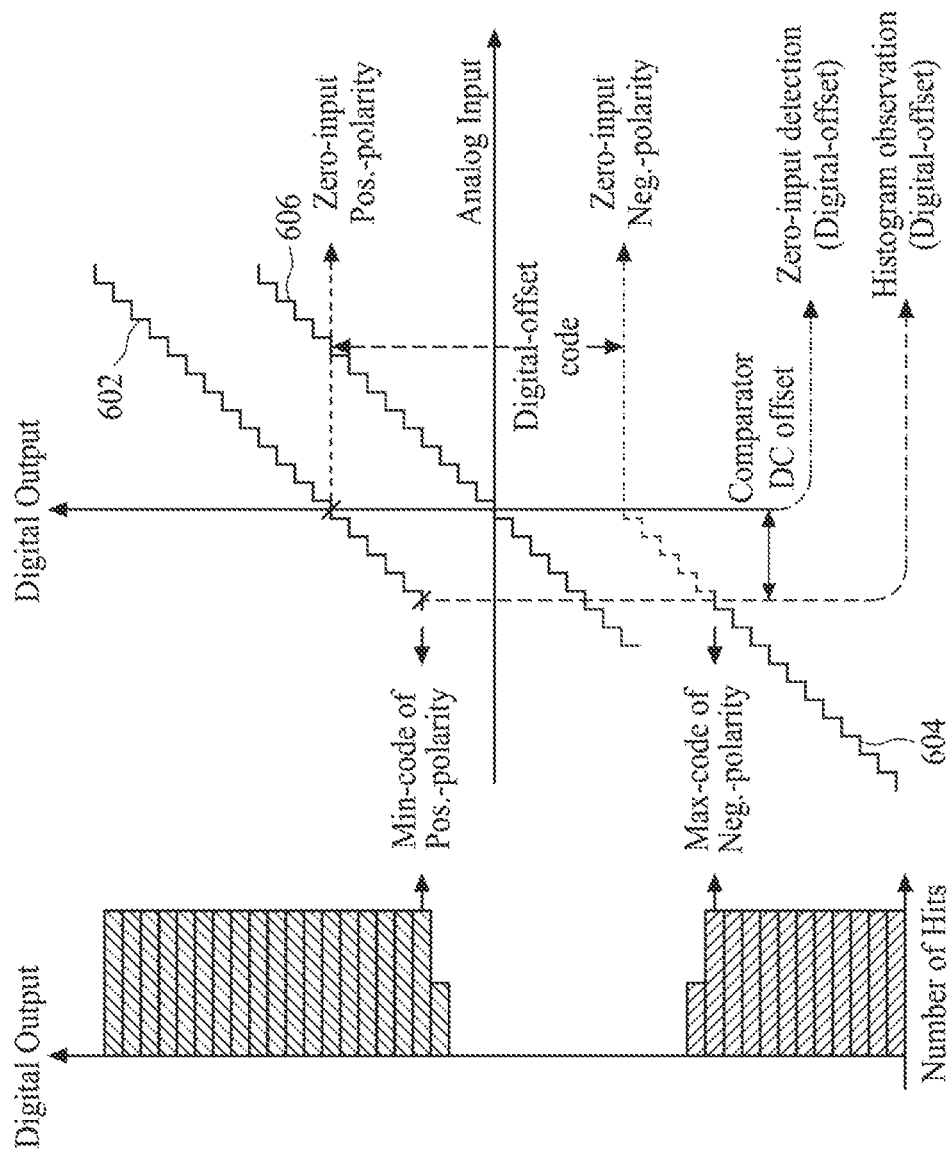
FIG. 6 is a diagram illustrating the characteristic of the transfer function curve of a signal converting apparatus according to an embodiment of the present invention.

Moreover, since the digital-offsets of the coarse and fine digital-slope conversion are input-independent, the combined digital-offset can be regarded as a DC offset in the digital-domain. In addition, the digital-slope quantizer (i.e. 404 and 406) is a unipolar conversion; hence the resulting digital-offset has different polarities depending on the input-polarity comparison. FIG. 6 is a diagram illustrating the characteristic of the transfer function curve of the signal converting apparatus 400 according to an embodiment of the present invention. There are three transfer function curves, i.e. 602, 604, and 606. The transfer function curve 602 is from positive polarity transfer curve for the input-polarity positive. The transfer function curve 604 is from negative polarity transfer curve for the input-polarity negative. The transfer function curve 606 is the corrected transfer curve. The corrected transfer function curve 606 can be obtained from the transfer function curve 602 and the transfer function curve 604, which contain the digital offset of the signal converting apparatus 400 due to the influence of the feedback-process latency. Therefore, the digital offset corrector 426 compensates for the digital-offset of the digital output with the different input-polarities. The digital-offset can be obtained by two offset detection modes, namely zero-input detection mode and histogram observation mode, which are foreground and background correction, respectively. The two offset detection modes are discussed below:

1) Zero-Input Detection: Zero-input detection is an on chip digital offset correction mode in the signal converting apparatus 400. Two quantifications within specified input-polarity comparison results are performed when a zero-input is applied. If forcing the input-polarity comparison result to be positive polarity, the zero-input positive polarity code can be found, and vice versa. Therefore, the digital-offset code between these two curves can be determined and can be compensated by the following correction algorithm.

2) Histogram Observation: The back-end off-chip digital signal-processing (DSP) circuit is used to obtain the digital offset between the transfer function curve 602 and the transfer function curve 604 through the histogram observation algorithm. The maximum-code of negative polarity and the minimum-code of positive polarity can be found by counting the number of occurrences or hits near the ends of the transfer function curve 602 and the transfer function curve 604. The digital-offset of the signal converting apparatus 400 can also be obtained by the difference between these two boundary codes. According to FIG. 6, the digital-offset code from the zero input detection mode is the same as the digital-offset code obtained by the histogram observation mode, and the input voltage difference between these two is the DC offset of the comparing device 402.

Figure 7:
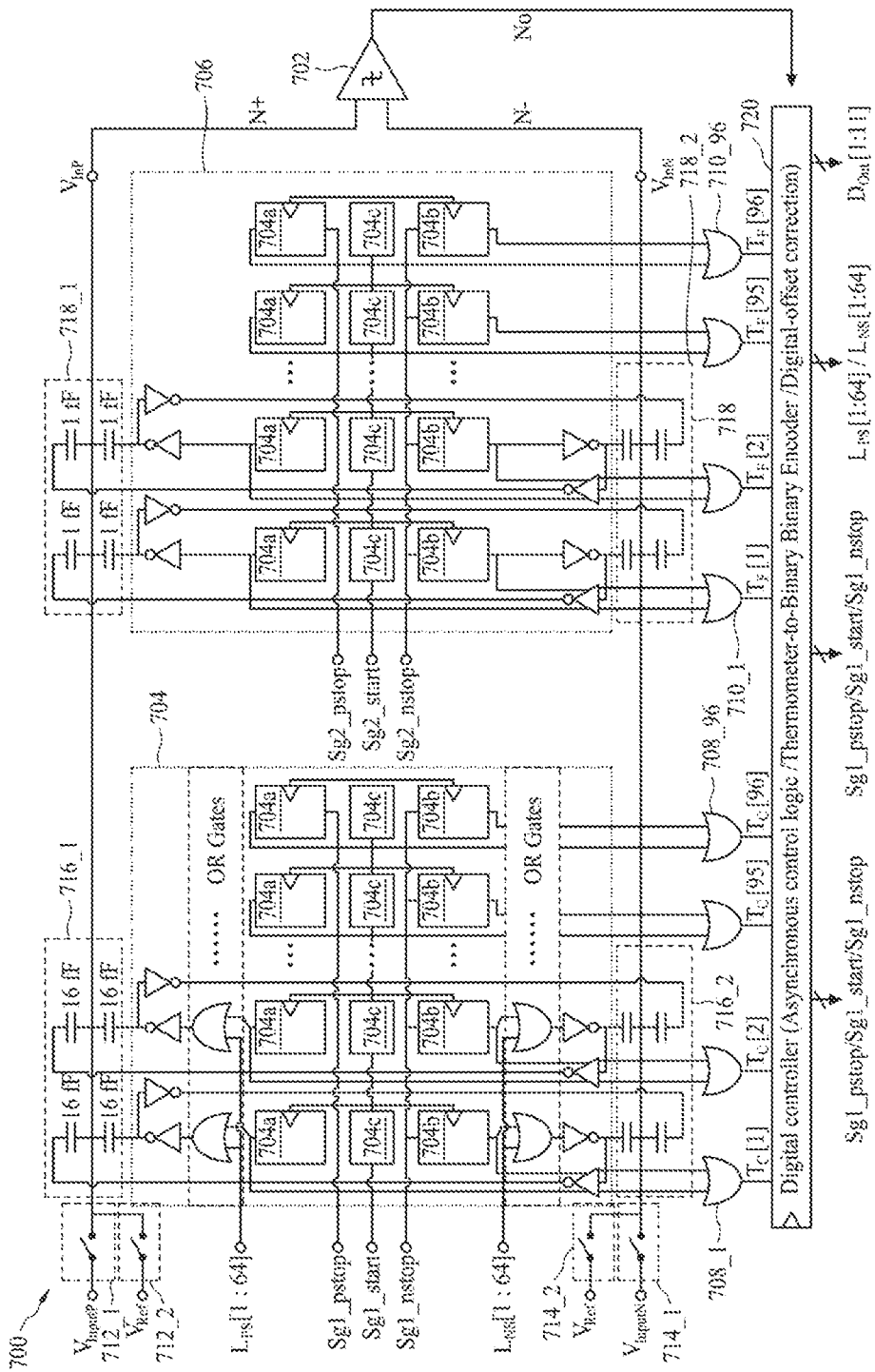
FIG. 7 is a block diagram illustrating a signal converting apparatus according to an embodiment of the present disclosure.

FIG. 7 is a block diagram illustrating a signal converting apparatus 700 according to an embodiment of the present disclosure. The signal converting apparatus 700 is a differential SAR-ADC. The operation of the signal converting apparatus 700 is mainly the same as the operation of the signal converting apparatus 400. In the embodiment as shown in FIG. 7, the signal converting apparatus 700 comprises a comparing device 702, a first digital-slope quantizer 704, a second digital-slope quantizer 706, a plurality of first OR gates 708_1~708_96, a plurality of second OR gates 710_1~710_96, a plurality of first switching devices 712_1~712_2, a plurality of second switching devices 714_1~714_2, a first capacitive device 716, a second capacitive device 718, and a digital controller 720. The comparing device 702 has a differential input port N+ and N− for receiving a differential received signal VInp, VInN and generating an output signal at an output port No. The first digital-slope quantizer 704 is coupled to the output port No and the input port N+ and N− for generating a first set of digital signals $T_C$ [1:64] to monotonically adjust the received signal VInp, VInN at the input port N+ and N− during the second cycle conversion phase 506 according to the first quantization unit Q1. The second digital-slope quantizer 706 is coupled to the output port No and the input port N+ and N− for generating a second set of digital signals $T_F$[1:64] to monotonically adjust the received signal VInp, VInN at the input port N+ and N− during the second cycle conversion phase 506 according to a second quantization unit Q2. The switching devices 712_1 and 714_1 are coupled to the input port N+ and N− for selectively conducting a first analog input signal $V_{InputP}$ and a second analog input signal $V_{InputN}$ to the input port N+ and N− respectively. The switching devices 712_2 and 714_2 are coupled to the input port N+ and N− for selectively conducting the reference voltage Vref to the input port N+ and N− respectively. The capacitive devices 716_1 and 716_2 are coupled to the switching devices 712_1 and 714_1 and the input port N+ and N− respectively. The capacitive devices 718_1 and 718_2 are coupled to the switching devices 712_1 and 714_1 and the input port N+ and N− respectively. The capacitance of the capacitive devices 716_1 and 716_2 is different from (e.g. is greater than) the capacitance of the capacitive devices 718_1 and 718_2. The connectivity among the comparing device 702, the first digital-slope quantizer 704, the second digital-slope quantizer 706, the plurality of first OR gates 708_1~708_96, the plurality of second OR gates 710_1~710_96, the plurality of first switching devices 712_1~712_2, the plurality of second switching devices 714_1~714_2, the first capacitive device 716, the second capacitive device 718, and the digital controller 720 are shown in FIG. 7, and the detailed description is omitted here for brevity.

In comparison to the comparing device 402, the comparing device 702 is a differential comparator. Similar to the above mentioned FIG. 5, during the coarse digital-slope conversion phase, when the polarity of the voltage difference of the received signal (which is a differential signal) VInp and VInN is the first polarity (e.g. positive), the first digital-slope quantizer 704 is arranged to increase the voltage difference of the received signal VInp and VInN at the input port N+ and N− by a first shifting voltage Vsf1 to generate a first shifted signal (e.g. Vs1) at the input port N+ and N−, and to monotonically reduce the voltage difference of the first shifted signal at the input port N+ and N− to generate the first set of digital signals $T_C$ [1:64] until polarity of the voltage difference of the first shifted signal at the input port N+ and N− changes into the second polarity (e.g. negative) according to the first quantization unit Q1.

Then, during the fine digital-slope conversion phase, when the voltage difference of the first shifted signal is adjusted to change into the second polarity, the second digital-slope quantizer 706 is further arranged to reduce the voltage difference of the first shifted signal at the input port by a second shifting voltage Vsf2 to generate a second shifted signal (e.g. Vs2) at the input port N+ and N−, and to monotonically reduce the voltage difference of the second shifted signal to generate the second set of digital signals $T_F$[1:64] until the polarity of the voltage difference of the second shifted signal at the input port changes into the first polarity according to the second quantization unit Q2.

Figure 8:
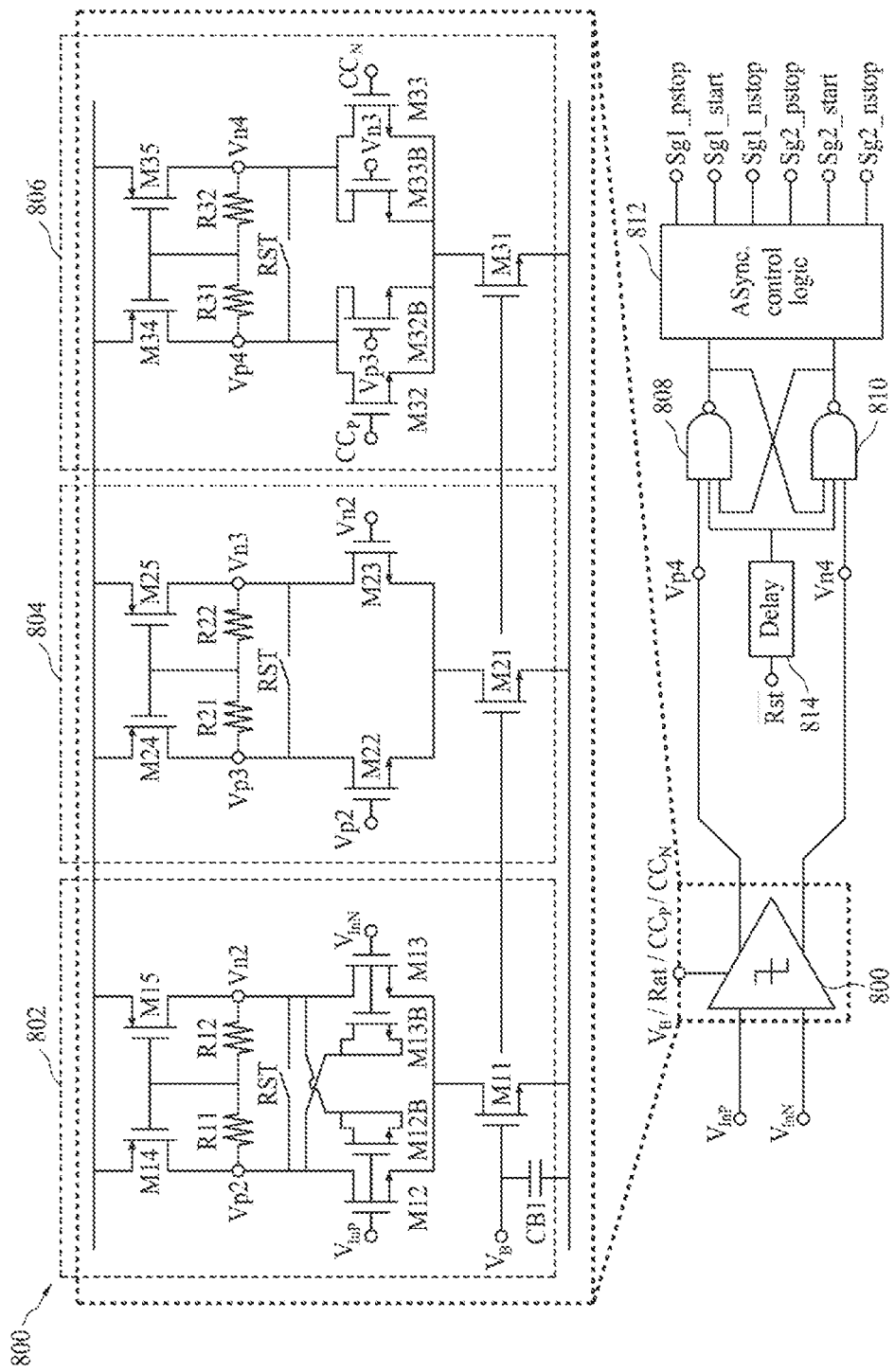
FIG. 8 is a block diagram illustrating a comparing device according to an embodiment of the present disclosure.

FIG. 8 is a block diagram illustrating a comparing device 800 according to an embodiment of the present disclosure. The comparing device 800 may be the comparing device 102, 402, or 702. The comparing device 800 is used as a zero-crossing detector in a digital slope conversion. According to the embodiment, relatively large currents and device size are used in amplifiers to increase the signal bandwidth of the comparing device 800 and reduce the device mismatch. A three-stage (i.e. 802, 804, and 806) resistor feedback amplifier with fully differential topology is connected in series with a three-input NAND based latch (i.e. 808 and 810) and an asynchronous control logic 812. The three-input NAND based latch (i.e. 808 and 810) and the asynchronous control logic 812 may be disposed in the digital controller 720. To reduce the hysteresis in the quantization process, each stage of the amplifiers 802, 804, and 806 contains a reset signal RST, which eliminates the memory effect that may occur during the pre-charge phase and ensures the settling-time stays constant. Besides, two cross-coupled input pairs, M12B and M13B, are used as a neutralization technique to reduce the kickback noise of the comparing device 800, and the input signals $CC_P$ and $CC_N$ are used to specify the output of the comparing device 800 during the zero-input detection. The reset signal RST controls the latch (i.e. 808 and 810) through a delay unit 814 to avoid the input-polarity comparison error caused by the frequency response of the comparing device 800. The asynchronous control logic 812 uses the binary phase detector as the latch and provides the asynchronous algorithm with other logic gates and digital buffers.

According to the embodiment, the amplifier 802 comprises a plurality of n-type field effected transistors M11, M12, M13, M11B, M12B, a plurality of p-type field effected transistors M14, M15, a plurality of resistors R11, R12, and a capacitor CB1. The amplifier 804 comprises a plurality of n-type field effected transistors M21, M22, M23, a plurality of p-type field effected transistors M24, M25, and a plurality of resistors R21, R22. The amplifier 806 comprises a plurality of n-type field effected transistors M31, M32, M33, M31B, M32B, a plurality of p-type field effected transistors M34, M35, and a plurality of resistors R31, R32. The connectivity inside and among the amplifiers 802, 804, and 806, the latch (i.e. 808 and 810), the delay unit 814, and the asynchronous control logic 812 are shown in FIG. 8, and the detailed description is omitted here for brevity.

During the input-polarity comparison phase, although the metastability issue of the comparing device 800 can be corrected by the coarse level-shifting, which has been mentioned in above paragraphs, a predicted comparison output is still required to perform the coarse level-shifting. Since the third stage 806 of the comparing device 800 is designed to have a high common-mode voltage, the differential output of the NAND-based latch (i.e. 808 and 810) represents "10" and "01" as the typical comparison signals, and "11" as the metastability. The asynchronous control logic 812 forces the "11" output to be assigned as "10" or "01", and the output of the digital-slope conversion can be corrected after the coarse level-shifting regardless of the predictions.

Please refer to FIG. 7 again. For the coarse digital-slope quantizer 704 and the fine digital-slope quantizer 706, each of which contains 96 (for example) dynamic latch pairs (including two dynamic latches (e.g. 704a and 704b) for different digital-slope polarities) with sufficient delay cells (e.g. 704c). The first 64 dynamic latch pairs are connected to the bottom-plate of the capacitors in the first capacitive device 716 representing in different polarities, and the remaining 32 units are used for the CLC circuit as latency compensation. All logic gates are customized with the logic effort to optimize gate delay and power consumption. The high-speed delay lines in the coarse digital-slope quantizer 704 and the fine digital-slope quantizer 706 are triggered by Sg1_start and Sg2_start during coarse and fine digital-slope quantization, respectively.

The control signals Sg1_pstop, Sg1_nstop, Sg2_pstop, and Sg2_nstop are controlled by the digital controller 720, and are used as control signals for the coarse digital-slope quantizer 704 and the fine digital-slope quantizer 706 respectively. When a zero-crossing happened, the corresponding control signal is immediately reset, and the corresponding digital-slope quantizer is frozen in their current state and indicate the counting results of two polarities through the OR gates 708_1~708_96 and 710_1~710_96 with the outputs $T_C[1:96]$ and $T_F[1:96]$ respectively.

According to the description of FIG. 5, if the result of the input-polarity comparison is positive, the coarse digital-slope conversion is negative, and the coarse and fine level-shifting are positive, and vice versa. Since the coarse digital-slope conversion has the opposite polarity to the coarse and fine level-shifting, the unary DAC, which composed of the first capacitive device 716, can be shared by two different functions operating in different polarities of the DAC. The OR gates 708_1~708_96 combine both coarse digital-slope conversion and level-shifting process with the control signals from the first digital-slope quantizer 704 and level-shifting control signals, respectively. The level-shifting control signal $L_{PS}[1:64]$ and $L_{NS}[1:64]$, represented in different polarities of the DAC, is controlled by the digital controller 720 and can be divided into coarse and fine level-shifting control signals $L_{PS}[1:32]/L_{NS}[1:32]$ and $L_{PS}[33:64]/L_{NS}[33:64]$, respectively. The coarse level-shifting is mainly to avoid the nonideal effects of the input polarity and nonlinear digital slope as mentioned above. According to the embodiment, the coarse level-shifting caused the reduction of the coarse digital-slope quantizer input-range to provide a resolution of 5.7-bit instead of 6-bit.

Briefly, a high resolution (e.g. 10.7 bit) and high speed (e.g. 300 MS/s) two-step digital-slope ADC architecture is proposed. Considering that the speed and power consumption of the digital-slope quantizer grows exponentially with the resolution, a hybrid ADC architecture is used, which combines the advantages of digital-slope quantizers and two-step ADC. A low-latency delay line based digital slope architecture is used to increase the conversion rate of the quantizer, and two digital-slope quantizers are used to quantize the input signal sequentially to alleviate the resolution limitation of the digital-slope quantizer. In the proposed hybrid ADC, the unary DAC and the continuous-time comparator are shared by two digital-slope quantizers to avoid additional calibration circuits. Each conversion requires three comparison cycles. The first is the input-polarity comparison since the digital-slope quantizer is a unipolar comparison. Secondly, the coarse digital-slope comparison gives a coarse approximation corresponding to the comparison polarity previously determined. Then a fine digital-slope comparison provides a residue quantification without amplification. The proposed two-step digital-slope ADC requires only a digital-offset correction circuit to encode three sets of outputs and correct the digital-offset. The digital-slope architecture shows excellent inherent accuracy and low complexity without using complicated calibration techniques. Since the proposed ADC is implemented based on digital logic, the down-scaling to the latest technology gives a significant performance improvement.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple", phrases "be coupled with," "couples with," and "coupling with" are is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

The foregoing is only one better embodiment of the present disclosure. The equivalent change or modification of the claims of the present disclosure fall within the scope of the present disclosure.

What is claimed is:

1. A signal converting apparatus, comprising:
   a comparing device, having a first input terminal and a second input terminal for receiving a first received signal and a second received signal respectively, and for generating an output signal at an output port, wherein the first received signal and the second received signal are arranged to be a differential received signal;
   a first digital-slope quantizer, coupled to the output port, the first input terminal, and the second input terminal, for generating a first set of digital signals to monotonically adjust the first received signal and the second received signal at the first input terminal and the second input terminal, respectively, during a first phase according to a first quantization unit; and
   a second digital-slope quantizer, coupled to the output port, the first input terminal, and the second input terminal, for generating a second set of digital signals to monotonically adjust the first received signal and the second received signal at the first input terminal and the second input terminal, respectively, during a second phase after the first phase according to a second quantization unit;
   wherein the second quantization unit is different from the first quantization unit.

2. The signal converting apparatus of claim 1, wherein the comparing device is a differential comparator.

3. The signal converting apparatus of claim 1, wherein the comparing device is a zero-crossing detector used in a digital slope conversion.

4. The signal converting apparatus of claim 1, wherein the second quantization unit is smaller than the first quantization unit.

5. The signal converting apparatus of claim 1, further comprising:
   a first switching device, coupled to the first input terminal, for selectively conducting a first analog input signal to the first input terminal;
   a second switching device, coupled to the second input terminal, for selectively conducting a second analog input signal to the second input terminal;
   a third switching device, coupled to the first input terminal, for selectively conducting a reference voltage to the first input terminal;
   a fourth switching device, coupled to the second input terminal, for selectively conducting the reference voltage to the second input terminal;

a first capacitive device, having a first terminal coupled to the first input terminal and a second terminal coupled to the first digital-slope quantizer;

a second capacitive device, having a first terminal coupled to the second input terminal and a second terminal coupled to the first digital-slope quantizer;

a third capacitive device, having a first terminal coupled to the first input terminal and a second terminal coupled to the second digital-slope quantizer; and a fourth capacitive device, having a first terminal coupled to the second input terminal and a second terminal coupled to the second digital-slope quantizer;

wherein capacitances of the first capacitive device and the second capacitive device are different from capacitances of the third capacitive device and the fourth capacitive device.

6. The signal converting apparatus of claim 5, wherein the capacitances of the first capacitive device and the second capacitive device are greater than the capacitances of the third capacitive device and the fourth capacitive device.

7. The signal converting apparatus of claim 5, further comprising a digital controller coupled to the output port, wherein the first digital-slope quantizer comprises:

a plurality of first delay units, coupled to the digital controller, for generating a plurality of first delayed control signals according to a first control signal;

a plurality of first latching circuits, coupled to the digital controller, the plurality of first delay units, and the second terminal of the first capacitive device, for monotonically adjusting the first received signal at the first input terminal according to the plurality of first delayed control signals and a second control signal during the first phase; and a plurality of second latching circuits, coupled to the digital controller, the plurality of first delay units, and the second terminal of the second capacitive device, for monotonically adjusting the second received signal at the second input terminal according to the plurality of first delayed control signals and a third control signal during the first phase.

8. The signal converting apparatus of claim 7, wherein the second digital-slope quantizer comprises:

a plurality of second delay units, coupled to the digital controller, for generating a plurality of second delayed control signals according to a fourth control signal;

a plurality of third latching circuits, coupled to the digital controller, the plurality of second delay units, and the second terminal of the third capacitive device, for monotonically adjusting the first received signal at the first input terminal according to the plurality of second delayed control signals and a fifth control signal during the second phase; and a plurality of fourth latching circuits, coupled to the digital controller, the plurality of second delay units, and the second terminal of the fourth capacitive device, for monotonically adjusting the second received signal at the second input terminal according to the plurality of second delayed control signals and a sixth control signal during the second phase.

9. The signal converting apparatus of claim 1, wherein, during the first phase, the first digital-slope quantizer is arranged to use a first shifting voltage to adjust a first voltage difference between the first received signal and the second received signal to generate a first shifted signal in between the first input terminal and the second input terminal when a polarity of the first voltage difference is a first polarity.

10. The signal converting apparatus of claim 9, wherein, during the first phase, the first digital-slope quantizer is further arranged to monotonically adjust the first shifted signal between the first input terminal and the second input terminal until the polarity of the first shifted signal changes into a second polarity different from the first polarity according to the first quantization unit.

11. The signal converting apparatus of claim 10, wherein, during the second phase, the second digital-slope quantizer is arranged to use a second shifting voltage to adjust the first shifted signal to generate a second shifted signal in between the first input terminal and the second input terminal when the polarity of the first shifted signal is the second polarity.

12. The signal converting apparatus of claim 11, wherein, during the second phase, the second digital-slope quantizer is further arranged to monotonically adjust the second shifted signal between the first input terminal and the second input terminal until the polarity of the second shifted signal changes into the first polarity different from the second polarity according to the second quantization unit.

13. The signal converting apparatus of claim 1, wherein the comparing device comprises:

a first differential resistor feedback amplifier, having a first input terminal and a second input terminal arranged to receive the first received signal and the second received signal respectively, a first output terminal and a second output terminal arranged to output a first output signal and a second output signal respectively, and a first switch coupled between the first output terminal and the second output terminal;

a second differential resistor feedback amplifier, having a third input terminal and a fourth input terminal arranged to receive the first output signal and the second output signal respectively, a third output terminal and a fourth output terminal arranged to output a third output signal and a fourth output signal respectively, and a second switch coupled between the third output terminal and the fourth output terminal; and a third differential resistor feedback amplifier, having a fifth input terminal and a sixth input terminal arranged to receive the third output signal and the fourth output signal respectively, a fifth output terminal and a sixth output terminal arranged to output a fifth output signal and a sixth output signal respectively, and a third switch coupled between the fifth output terminal and the sixth output terminal;

wherein the first switch, the second switch, and the third switch are controlled by a reset signal.

14. The signal converting apparatus of claim 13, wherein the first differential resistor feedback amplifier further comprises:

a first field effected transistor, having a first gate terminal for receiving the first received signal, a first connecting terminal coupled to the second output terminal, and a second connecting terminal coupled to the second output terminal; and a second field effected transistor, having a first gate terminal for receiving the second received signal, a first connecting terminal coupled to the first output terminal, and a second connecting terminal coupled to the first output terminal.

15. A signal converting method, comprising:

arranging an input port of a comparing device to receive a received signal and to generate an output signal at an output port of the comparing device;

generating a first set of digital signals to monotonically adjust the received signal at the input port during a first phase according to a first quantization unit; and generating a second set of digital signals to monotonically adjust the received signal at the input port during a second phase after the first phase according to a second quantization unit;

wherein the second quantization unit is different from the first quantization unit.

16. The signal converting method of claim 15, wherein the second quantization unit is smaller than the first quantization unit.

17. The signal converting method of claim 15, further comprising:

arranging a switching device to selectively conduct an analog input signal to the input port;

arranging a first capacitive device to couple to the switching device and the input port; and arranging a second capacitive device couple to the switching device and the input port;

wherein a first capacitance of the first capacitive device is different from a second capacitance of the second capacitive device.

18. The signal converting method of claim 17, further comprising:

during a third phase before the first phase, arranging the switching device to conduct the analog input signal to the input port, and arranging the first capacitive device together with the second capacitive device to track and hold the analog input signal to generate the received signal.

19. The signal converting method of claim 15, wherein when a polarity of a voltage difference of the received signal is a first polarity, the step of generating the first set of digital signals to monotonically adjust the received signal at the input port during the first phase according to the first quantization unit comprises:

increasing the voltage difference of the received signal at the input port by a first shifting voltage to generate a first shifted signal at the input port; and monotonically reducing the voltage difference of the first shifted signal at the input port to generate the first set of digital signals until the polarity of the voltage difference of the first shifted signal at the input port changes into a second polarity different from the first polarity according to the first quantization unit.

20. The signal converting method of claim 19, wherein when the voltage difference of the first shifted signal is adjusted to change into the second polarity, the step of generating the second set of digital signals to monotonically adjust the received signal at the input port during the second phase after the first phase according to the second quantization unit comprises:

reducing the voltage difference of the first shifted signal at the input port by a second shifting voltage to generate a second shifted signal at the input port; and monotonically reducing the voltage difference of the second shifted signal to generate the second set of digital signals during the second phase until the polarity of the voltage difference of the second shifted signal at the input port changes into the first polarity according to the second quantization unit.

* * * * *